United States Patent [19]
Niitsuma et al.

[11] Patent Number: 4,625,184
[45] Date of Patent: Nov. 25, 1986

[54] SURFACE ACOUSTIC WAVE DEVICE WITH IMPEDANCE MATCHING NETWORK FORMED THEREON

[75] Inventors: Teruo Niitsuma; Takeshi Okamoto; Shoichi Minagawa, all of Tokyo, Japan

[73] Assignee: Clarion Co., Ltd., Tokyo, Japan

[21] Appl. No.: 508,397

[22] Filed: Jun. 27, 1983

[30] Foreign Application Priority Data

Jul. 2, 1982 [JP] Japan .............................. 57-115658
Jul. 2, 1982 [JP] Japan .............................. 57-115659

[51] Int. Cl.[4] .............................................. H03H 9/25
[52] U.S. Cl. ..................................... 333/150; 333/152; 333/32; 333/193; 333/154; 310/313 R
[58] Field of Search ............... 333/193, 194, 195, 150, 333/151, 152, 153, 154, 32; 310/313 R, 313 B, 313 C, 313 D

[56] References Cited

U.S. PATENT DOCUMENTS

| | | | |
|---|---|---|---|
| 4,025,954 | 5/1977 | Bert ................................... | 333/153 X |
| 4,124,828 | 11/1978 | Bert ................................... | 333/195 X |
| 4,137,470 | 1/1979 | Desormiere et al. ............ | 333/193 X |
| 4,409,567 | 10/1983 | Setsune et al. ..................... | 333/151 |
| 4,449,107 | 3/1984 | Asai et al. ......................... | 333/193 X |

FOREIGN PATENT DOCUMENTS

| | | | |
|---|---|---|---|
| 0030360 | 3/1977 | Japan .................................... | 333/193 |
| 0014654 | 2/1979 | Japan .................................... | 333/150 |
| 0003280 | 1/1980 | Japan .................................... | 333/193 |

OTHER PUBLICATIONS

Yamaguchi, M. and Kogo, H., "Design of SAW Filter by Taking Account of Electrical Termination and Matching Circuits", *Electronics Letters*, 15 Apr., 1976, pp. 181–182.

"Method of Electromagnetically Feeding and Matching UHF Band Saw Device Using Balanced Strip Line"; Tooru Nomura, Oct. 1980, and partial translation.

*Primary Examiner*—Eugene R. LaRoche
*Assistant Examiner*—Benny Lee
*Attorney, Agent, or Firm*—Flynn, Thiel, Boutell & Tanis

[57] ABSTRACT

The surface acoustic wave device comprises an elastic substrate, a piezoelectric film deposited on the elastic substrate, and transducers and matching circuits both provided on the piezoelectric film or along the interface between the piezoelectric film and the elastic substrate.

10 Claims, 21 Drawing Figures

SURFACE ACOUSTIC WAVE DEVICE WITH IMPEDANCE MATCHING NETWORK FORMED THEREON

BACKGROUND OF THE INVENTION

1. Field of the Invention

This invention relates to a surface acoustic wave device wherein a surface acoustic wave element and a matching circuit therefor are formed on a single substrate.

2. Description of the Prior Art

A surface acoustic wave device is made of a piezoelectric single crystalline material such as crystal, lithium niobate ($LiNbO_3$), etc., a piezoelectric ceramic material, or alternatively a combination of a non-piezoelectric plate and a piezoelectric film deposited thereon. To actually use the surface acoustic wave device as a circuit constituent, it is necessary to match the device with outer or external circuits.

FIG. 1 shows a conventional construction to use such a surface acoustic wave device as a circuit constituent. The surface acoustic wave device 4 includes a piezolelectric substrate 1, an input transducer 2 and an output transducer 3 both provided on the substrate 1. Matching circuits 5, 6 are each connected at one end thereof to a respective one of the input and output ends of the device 4 and are connected at the other ends to a signal source 7 and to a load 8, respectively. When an electric signal is applied to the input transducer 2 from the signal source 7 via the matching circuit 5, it is converted into a surface acoustic wave by the input transducer 2. The surface acoustic wave travels along the surface of the piezoelectric substrate 1, and when it reaches the output transducer 3, it is reconverted to an electric signal. The electric signal is then applied to the load 8 via the matching circuit 6. In this process, the matching circuits 5 and 6 are indispensable to reduce conversion loss caused upon conversions from an electric signal to a surface acoustic wave or vice versa. So, almost all of such devices are accompanied by such matching circuits at least at the input ends or the output ends thereof.

The matching circuits 5 and 6 each consist of an independent member such as an inductive equivalent element (a coil, for example), a capacitive equivalent element (a condenser, for example), etc. These elements are bulky as compared to the surface acoustic wave device itself. As the result, a considerably large space is needed as a whole for provision of the surface acoustic wave device for actual use thereof as a circuit constituent. Further, the number of the parts of the device and its mounting processes increase because the coils and the condensers are independent members. Additionally, the matching circuits must be adjusted after being assembled. These circumstances cause an increase in the production cost of the device.

OBJECT OF THE INVENTION

It is therefore an object of the invention to alleviate the drawbacks involved in the prior art by providing a compact surface acoustic wave device wherein a surface acoustic wave element and associated matching circuits are incorporated on a single piezoelectric substrate.

SUMMARY OF THE INVENTION

In accordance with the present invention, a surface acoustic wave device comprising a piezoelectric substrate made of an elastic plate and a piezoelectric film deposited thereon is characterized in that transducers and matching circuits both are provided on the piezoelectric film or between the piezoelectric film and the elastic plate.

DETAILED DESCRIPTION OF THE PREFERRED EMBODIMENTS

Figure 1:
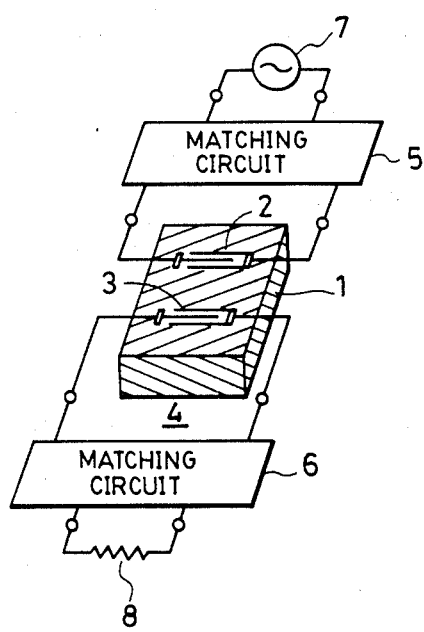
FIG. 1 shows a general construction of a conventional circuit which includes a surface acoustic wave device.

The invention will now be described in detail by way of preferred embodiments referring to the drawings.

Figure 2:
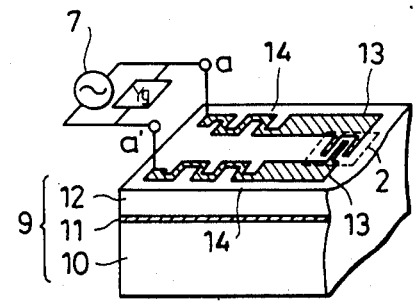
FIGS. 2, 8 and 9 are perspective views showing preferred embodiments of the invention.

FIG. 2 is an outlined perspective view showing an embodiment of the surface acoustic wave device according to the present invention. A piezoelectric substrate 9 is made of an elastic plate 10, a conductive film 11 deposited on the plate 10 and a piezoelectric film 12 deposited on the conductive film 11. The uppermost piezoelectric film 12 carries thereon rectangular patterns 13 and strip lines 14 both made of a conductive film. Reference numeral 7 is a signal source, Yg is an admittance inside the signal source 7, and, a and a' are terminals of the signal source 7.

Figure 3:
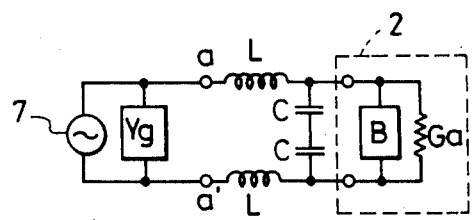
FIG. 3 is a equivalent circuit diagram.

FIG. 3 is an equivalent circuit of FIG. 2. Reference letter L designates an inductance (inductive equivalent element) consisting of the strip line 14, and C is a capacitance (capacitive equivalent element) consisting of the rectangular pattern 13, piezoelectric film 12 and conductive film 11. Reference letter Ga denotes a radiant conductance of the input transducer 2 and B denotes a sum of a radiant susceptance of the input transducer 2 and a susceptance due to inter-electrode capacitance. When the total admittance to the right of the terminals a and a' is expressed by Ya, the condition Ya=Yg necessary to match the surface acoustic wave element with outer circuits can be realized by properly adjusting the value of the inductance L and the capacitance C, respectively.

The inductance L and the capacitance C can be easily adjusted by designing the most suitable mask pattern for the strip lines 14 to be provided on the piezoelectric film 12 by use of the conductive film, and by employing a photolithographic method. The strip lines 14 and the rectangular patterns 13 may be formed simultaneously with the input transducer 2.

Thus, the strip lines 14 and the rectangular patterns 13 operate as a matching circuit including the inductance L and the capacitance C to match the surface acoustic wave element with outer circuits. In this case, the inductance L consists of the strip line 14 while the capacitance C consists of the rectangular pattern 13, piezoelectric film 12 and conductive film 11. FIG. 2 only shows a half of the surface acoustic wave element including the input transducer 2. However, the other half including the output transducer 3 may be constructed identically.

Figure 4:
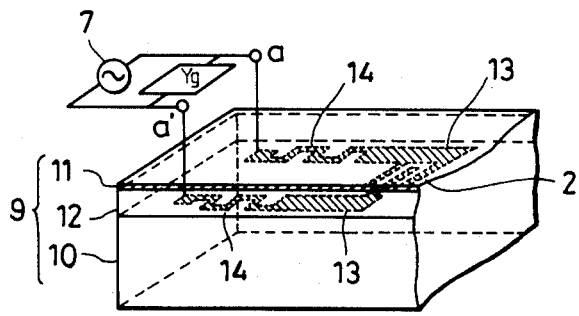
FIGS. 4, 10 and 11 are perspective views of further embodiments also revealing their internal structures.

FIG. 4 shows another embodiment according to the invention. The rectangular patterns 13 and the strip lines 14 both made of the conductive film are provided along the interface between the piezoelectric film 12 and the elastic plate 10. The conductive layer 11 is deposited on the piezoelectric film 12. This construction also realizes the same effect as the construction of FIG. 2 does.

Figure 5:
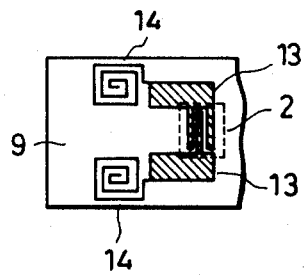
FIGS. 5 to 7 are plan views of respective further alternative embodiments.
Figure 6:
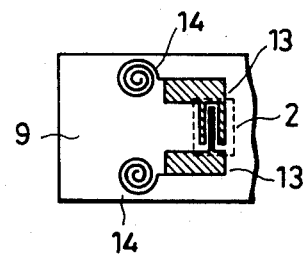
Figure 7:
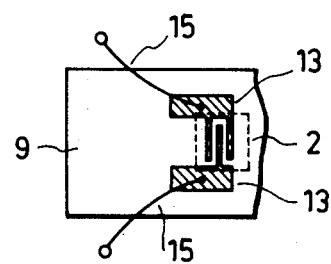

The strip line 14 which constitutes the inductance L of the matching circuit may be formed in a spiral pattern as shown by FIG. 5 or FIG. 6, or alternatively, may be made of a bonding wire 15 as shown by FIG. 7.

Figure 8:
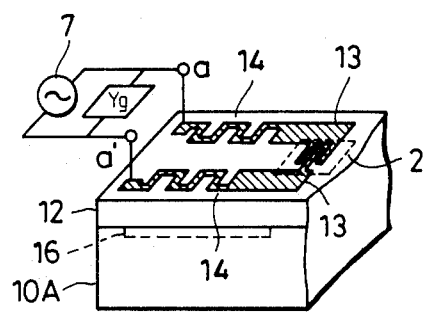

FIG. 8 shows a further embodiment of the invention. In FIG. 8, the same or similar constituents as those of FIG. 2 are designated by the same reference numerals or letters. A semiconductive substrate 10A is made of silicon, gallium arsenic (GaAs), SOS (silicon-on-sapphire), etc. while the piezoelectric film 12 is made of zinc oxide (ZnO), aliminium nitride (AlN), etc. A sputtering or CVD method may be employed to provide the piezoelectric film 12 on the semiconductive substrate 10A. A low resistance zone 16 is formed along the upper face of the semiconductive substrate 10A at least at a part thereof confronting the rectangular pattern 13 by diffusing impurities therein.

Thus, the capacitance C of the matching circuit is made up of the rectangular pattern 13, piezoelectric film 12 and semiconductive low resistance zone 16.

Figure 9:
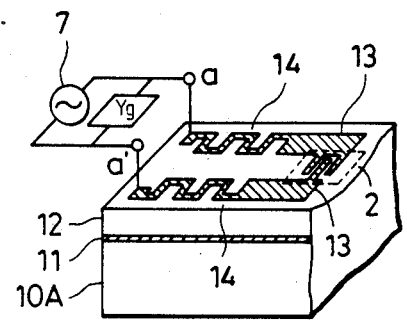

FIG. 9 shows a still further embodiment of the invention wherein the conductive film 11 is sandwiched by the semiconductive substrate 10A and the piezoelectric film 12. In this case, the capacitance C is made up of the rectangular pattern 13, piezoelectric film 12 and conductive film 11.

Figure 10:
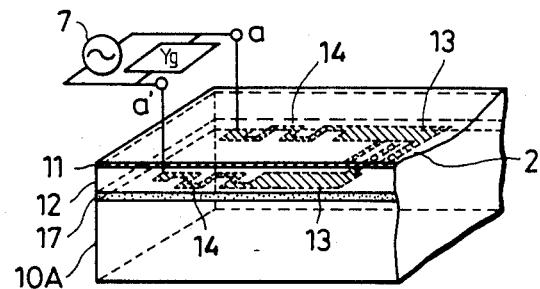

FIG. 10 shows a still further embodiment of the invention wherein the rectangular patterns 13 and the strip lines 14 are provided on an insulative film 17 which is deposited on the semiconductive substrate 10A. The conductive film 11 is deposited on the piezoelectric film above the patterns 13 and the strip lines 14. Thus, the capacitance C is made up of the conductive film 11, piezoelectric film 12 and rectangular pattern 13.

Figure 11:
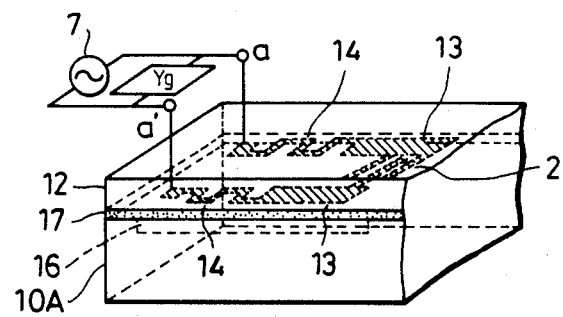

FIG. 11 shows a still further embodiment of the invention wherein the rectangular patterns 13 and the strip lines 14 are provided on the insulative film 17 which is deposited on the semiconductive substrate 10A involving the low resistance zone 16. Thus, the capacitance C is made up of the rectangular pattern 13, insulative film 17 and semiconductive low-resistance zone 16.

The inductance L in each construction of FIGS. 8 to 11 is made up of the strip line 14 as it is in the first embodiment of FIG. 2, and is associated with each capacitance C to constitute the matching circuit. The aspects of the strip line 14 shown by FIGS. 5 to 7 may be also employed upon making the inductance L of FIGS. 8 to 11.

When the piezoelectric substrate is made of a combination of the semiconductive substrate and the piezoelectric film as in the embodiments of FIGS. 8 to 11, in particular, it is possible to include electronic circuit elements, by using techniques such as IC, LSI, etc., and the surface acoustic wave element together on the semiconductor substrate.

Thickness or shapes of the rectangular pattern 13, conductive film 11, piezoelectric film 12 and insulative film 17, all constituting the capacitance C, or the strip line 14 constituting the inductance L, are not restricted to the examples shown in the Figures, and may be selected as desired according to intended use of the device.

It is not necessary to always provide both the capacitance C (capacitive equivalent element) and the inductance L (inductive equivalent element) to construct the matching circuit. Even if one of them is omitted, the purpose of matching the surface acoustic wave element with outer circuits can be attained.

Figure 12:
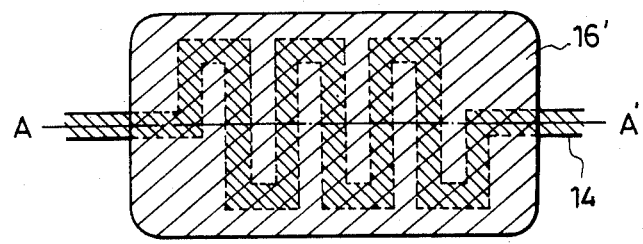
FIGS. 12A and 12B are a plan view and a sectional view both showing a further embodiment of the invention.
Figure 12:

FIGS. 12A and 12B show a further embodiment of the invention, and particularly show a construction of the inductance L. The strip line 14 is formed on the piezoelectric substrate, and a magnetic film 16' covers the strip line 14.

Figure 13:
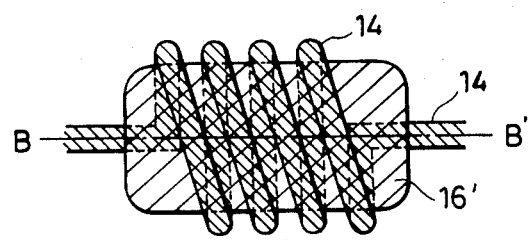
FIGS. 13A and 13B are a plan view and a sectional view both showing a still further embodiment of the invention.
Figure 13:
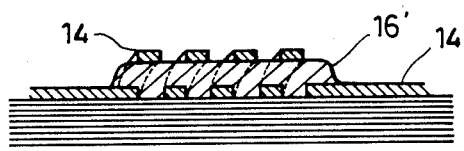

FIGS. 13A and 13B show a still further embodiment. The strip line 14 is configured as a three-dimensional coil, and the magnetic film 16' is formed so as to be a core of the coil, thereby constructing a cored solenoid type inductance L. By thus combining the strip line 14 with the magnetic film 16' to construct the inductance L, the value is significantly increased.

A method of fabricating the structure of FIGS. 13A and 13B will be described hereunder.

Figure 14A:
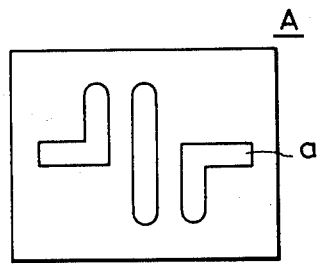
FIGS. 14A, 14B and 14C show masks employed to fabricate the construction of the embodiment of FIGS. 13A and 13B.
Figure 15A:
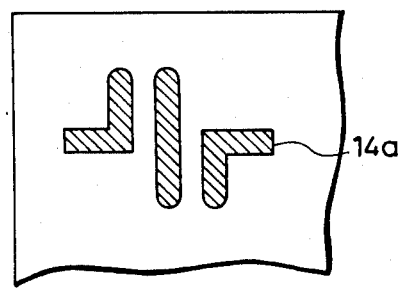
FIGS. 15A, 15B and 15C show the process used to fabricate the construction of the embodiment of FIGS. 13A and 13B.
Figure 14B:
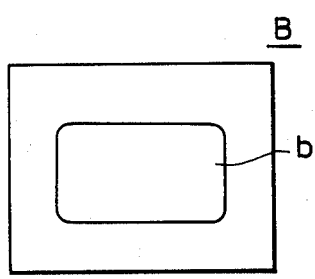
Figure 15B:
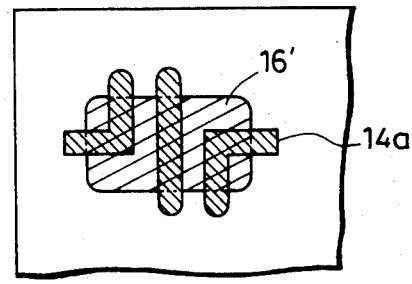
Figure 14C:
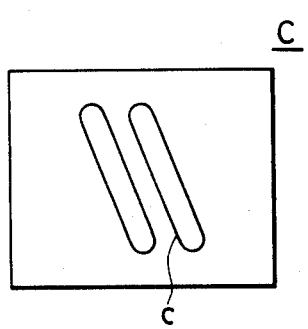
Figure 15C:
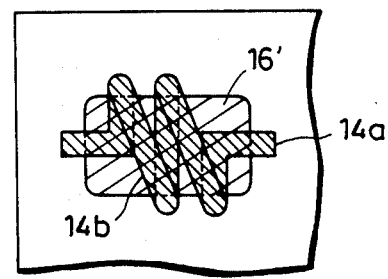

FIGS. 14A, 14B and 14C show masks to be used for fabrication of the structure of FIGS. 13A and 13B. By sequentially using the masks, the patterns as shown by FIGS. 15A, 15B and 15C are sequentially superposed. First, the mask A of FIG. 14A having a pattern a is used to deposit a conductive film 14a as shown in FIG. 15A which is to be positioned under the strip line 14. Next, the mask B of FIG. 14B having a pattern b is used to deposit a magnetic film 16' as shown in FIG. 15B on the conductive film 14a. Finally, the mask C having a pattern c is used to deposit a conductive film 14b as shown in FIG. 15C on the magnetic film 16' so that the conductive film 14b is connected to the conductive film 14a and is positioned above the strip line 14. Thus, the cored solenoid type inductance L of FIGS. 13A and 13B is obtained.

As described above, the surface acoustic wave device according to the invention can alleviate the drawbacks involved in the prior art because the matching circuits to match the device with outer circuits are incorporated together with the transducers into the device itself, namely, on the piezoelectric film or between the piezoelectric film and the elastic plate of the piezoelectric substrate, which is made of the elastic plate and the piezoelectric film deposited thereon.

More specifically, since the surface acoustic wave element and the matching circuits necessary therefor can be provided on the single piezoelectric substrate, the overall dimension of the surface acoustic wave device decreases. Beside this, the manufacturing process of the device is shortened because the number of the parts of the matching circuit decreases and a step for mounting the matching circuits is omitted. Further, adjustment of the matching circuits is not needed because they are previously designed to effect the best function and are integrally incorporated in the surface acoustic wave device.

These advantages lead to a cost reduction of the device.

The embodiments of the invention in which an exclusive property or privilege is claimed are defined as follows:

1. A surface acoustic wave device which comprises:
   a piezoelectric substrate which includes a semiconductor substrate and a piezoelectric film deposited on said semiconductor substrate, said semiconductor substrate including means defining a low resistance zone along a surface thereof having said piezoelectric film thereon;
   transducer means provided on said piezoelectric substrate;
   at least one pair of rectangular patterns of conductive film provided on said piezoelectric film and connected to said transducer means, said rectangular patterns being aligned with said low resistance zone; and
   strip lines of conductive film provided on said piezoelectric film and each having an end which is connected to a respective one of said rectangular patterns, said strip lines being aligned with said low resistance zone;
   said piezoelectric substrate, said low resistance zone, said rectangular patterns and said strip lines serving as a matching circuit which matches the electrical admittance of said surface acoustic wave device with the electrical admittance of an external circuit to be connected to ends of said strip lines remote from said rectangular patterns.

2. The surface acoustic wave device according to claim 1, wherein said transducer means includes first, second and third spaced transducer electrodes provided on said piezoelectric film so that said second electrode is between said first and third transducer electrodes, one of said rectangular patterns being connected to said first and third transducer electrodes and the other of said rectangular patterns being connected to said second transducer electrode.

3. A surface acoustic wave device, comprising: a piezoelectric substrate; transducer means provided on said piezoelectric substrate; first and second sections of conductive film which are generally rectangular, are provided on said piezoelectric substrate, and are electrically connected to said transducer means; and first and second strip lines which are provided on said piezoelectric substrate and which each have an end connected to a respective one of said first and second sections of conductive film; said piezoelectric substrate, said first and second sections and said strip lines serving as a matching circuit which matches the electrical admittance of said surface acoustic wave device to the electrical admittance of an external circuit to be connected to ends of said strip lines remote from said first and second sections of conductive film; wherein said piezoelectric substrate includes a semiconductor substrate and a piezoelectric film deposited thereon, wherein said transducer means, said first and second sections of conductive film and said strip lines are provided on a side of said piezoelectric film remote from said semiconductor substrate, and wherein said semiconductor substrate includes means defining a low resistance zone adjacent said piezoelectric film and aligned with said strip lines and said first and second sections of conductive film.

4. The surface acoustic wave device according to claim 3, wherein each of said strip lines is made of a conductive film and is approximately serpentine-shaped.

5. The surface acoustic wave device according to claim 3, wherein each of said strip lines is made of a conductive film and is arranged in a spiral.

6. The surface acoustic wave device according to claim 3, wherein each of said strip lines is a bonding wire.

7. The surface acoustic wave device according to claim 3, including a magnetic film which partly covers at least one of said strip lines.

8. A surface acoustic wave device which comprises:
   a piezoelectric substrate which includes a semiconductor substrate, an insulative film deposited on said semiconductor substrate, and a piezoelectric film deposited on said insulative film;
   transducer means provided on said insulative film;
   at least one pair of rectangular patterns of conductive film provided on said insulative film and connected to said transducer means; and
   strip lines of conductive film provided on said insulative film and each having an end which is connected to a respective one of said rectangular patterns;
   said substrate, said rectangular patterns and said strip lines serving as a matching circuit which matches the electrical admittance of said surface acoustic wave device with the electrical admittance of an external circuit to be connected to ends of said strip lines remote from said rectangular patterns, said semiconductor substrate including a low resistance zone along a surface thereof having said insulative film thereon.

9. A surface acoustic wave device, comprising: a piezoelectric substrate; transducer means provided on said piezoelectric substrate; first and second sections of conductive film which are generally rectangular, are provided on said piezoelectric substrate, and are electrically connected to said transducer means; and first and second strip lines which are provided on said piezoelectric substrate and which each have an end connected to a respective one of said first and second sections of conductive film; said piezoelectric substrate, said first and second sections and said strip lines serving as a matching circuit which matches the electrical admittance of said surface acoustic wave device to the electrical admittance of an external circuit to be connected to ends of said strip lines remote from said first and second sections of conductive film; wherein said piezoelectric substrate includes a semiconductor substrate, an insulative film, and a piezoelectric film, said insulative film being provided between said piezoelectric film and said semiconductor substrate, wherein said transducer means, said first and second sections of conductive film and said strip lines are provided on a side of said insulative film adjacent said piezoelectric film, and wherein said semiconductor substrate including means defining a low resistance zone which is adjacent said insulative film and aligned with said first and second sections of conductive film.

10. The surface acoustic wave device according to claim 9, including a magnetic film which partly covers at least one said strip line.

* * * * *